United States Patent [19]
Reynolds

[11] Patent Number: 5,742,213
[45] Date of Patent: *Apr. 21, 1998

[54] UNBALANCED TO BALANCED HIGH IMPEDANCE RATIO WIDEBAND TRANSFORMER CIRCUIT

[75] Inventor: Robert L. Reynolds, Platteville, Colo.

[73] Assignee: Vari-L Company, Inc., Denver, Colo.

[*] Notice: The term of this patent shall not extend beyond the expiration date of Pat. No. 5,619,172.

[21] Appl. No.: 755,705

[22] Filed: Nov. 25, 1996

Related U.S. Application Data

[63] Continuation-in-part of Ser. No. 527,861, Sep. 14, 1995, Pat. No. 5,619,172.

[51] Int. Cl.$^6$ .................. H03H 7/46; H03H 7/42
[52] U.S. Cl. ........................... 333/131; 333/25
[58] Field of Search ..................... 333/25, 26, 119, 333/131; 336/221, 233

[56] References Cited

U.S. PATENT DOCUMENTS

| | | | |
|---|---|---|---|
| 3,244,998 | 4/1966 | Broadhead, Jr. | 330/306 |
| 3,882,432 | 5/1975 | Bowman et al. | 333/32 |
| 4,201,962 | 5/1980 | Hosoya et al. | 333/32 X |
| 5,051,710 | 9/1991 | Kaltenecker | 333/32 |
| 5,216,393 | 6/1993 | Wandel | 333/32 |
| 5,309,120 | 5/1994 | Koontz | 333/32 |
| 5,495,212 | 2/1996 | DeCramer | 333/25 |

Primary Examiner—Paul Gensler
Attorney, Agent, or Firm—Ancel W. Lewis, Jr.

[57] ABSTRACT

A transformer circuit disclosed performs wideband impedance transformation (matching) and can be used for voltage step-up and step-down applications. The circuit disclosed is comprised of two transmission line transformers and two reactive impedances that compensate the circuit for impedance versus frequency. The circuit disclosed performs a very wideband impedance ratio of 1:9. The circuit may have different turns ratios for transformers T1 and T2 and different values for reactive impedances Z1 and Z2 to accommodate rational, fractional and integer values of transformation up to an impedance ratio of 16:1. Incorporation of a balun in the second transformer provides balanced output.

25 Claims, 5 Drawing Sheets

5,742,213

UNBALANCED TO BALANCED HIGH IMPEDANCE RATIO WIDEBAND TRANSFORMER CIRCUIT

This is a continuation-in-part of application Ser. No. 527,861 filed Sep. 14, 1995, U.S. Pat. No. 5,619,172.

TECHNICAL FIELD

The present invention relates to impedance transformers and more particularly to high impedance ratio transformer circuits operable at a wide range of frequencies on the order of 5 MHz to 1.2 GHz and 10 MHz to 1.6 GHz.

BACKGROUND ART

Conventional single core autotransformers and transmission line transformers are well known in the electronics industry for impedance or voltage step-up and step-down applications. An autotransformer is a transformer having a single winding that serves as both the primary winding and the secondary winding. A transmission line transformer is a transformer that uses twisted pair wire for the windings. Transmission line autotransformers are known to work fairly well up to 1 GHz with an impedance ratio of 4:1 or less. At higher impedance ratios, however, the high frequency response is limited by the length of the windings as they approach a quarter wavelength and thereby induce a resonance. Typically, the higher ratio impedance in a transformer's performance is limited by the electrical length of the secondary windings.

Broadhead, Jr. U.S. Pat. No. 3,244,998 discloses an impedance transformer circuit using a single toroid core that is suitable for operating up to about 80 MHz.

Wandel U.S. Pat. No. 5,216,393 discloses an impedance transformer circuit in which a double aperture ferrite core is used as well as an autotransformer having the first and second windings twisted together and wrapped through the apertures of the double ferrite aperture core. This patent discloses performance within a band width from 47 MHz up through 860 MHz.

DISCLOSURE OF THE INVENTION

In accordance with the present invention there is provided a transformer circuit having two transmission line transformers With the first winding of the first transformer connected to a low impedance port and a second winding of the first transformer connected to the first winding of a second transformer via a first reactive impedance with the second winding of the second transformer connected to a high impedance port. The transformers shown are wound on a double aperture ferrite core and utilize a twisted pair configuration between the primary and secondary windings. A second reactive impedance is connected between the low impedance port and ground. The magnitude of the first and second impedances are balanced to give a response in which impedance ratios of about 9:1 to 16:1 and frequency responses from about 5 MHz to 1.2 GHz may be achieved. The addition of an unbalanced to a balanced transmission line transformer known as a balun and specifically a 1:1 balun connected to the output provides an unbalanced input to a balanced output.

In a second and third embodiment, there is provided a transformer circuit having two transformers, the first transformer an autotransformer and the second transformer incorporating a balun in a 1:4 step-up configuration, with the primary winding of the first transformer connected to a low impedance port and the secondary winding of the first transformer connected to the primary winding of the second transformer via a first reactive impedance with the secondary winding of the second transformer connected to a high impedance port. The transformers shown utilize a twisted pair configuration between the primary and secondary windings wound on a double aperture ferrite core. A second reactive impedance is connected between the low impedance port and ground. The first and second reactive impedances are balanced to give a response in which impedance ratios of about 9:1 to 16:1 and frequency responses from about 10 MHz to 1.6 GHz may be achieved. The second embodiment shown utilizes a D.C. isolated second transformer and the third embodiment shown utilizes a D.C. coupled second transformer.

BRIEF DESCRIPTION OF THE DRAWINGS

Details of this invention are described in connection with the accompanying drawings which like parts bear similar reference numerals in which.

DETAILED DESCRIPTION OF THE INVENTION

Figure 1:
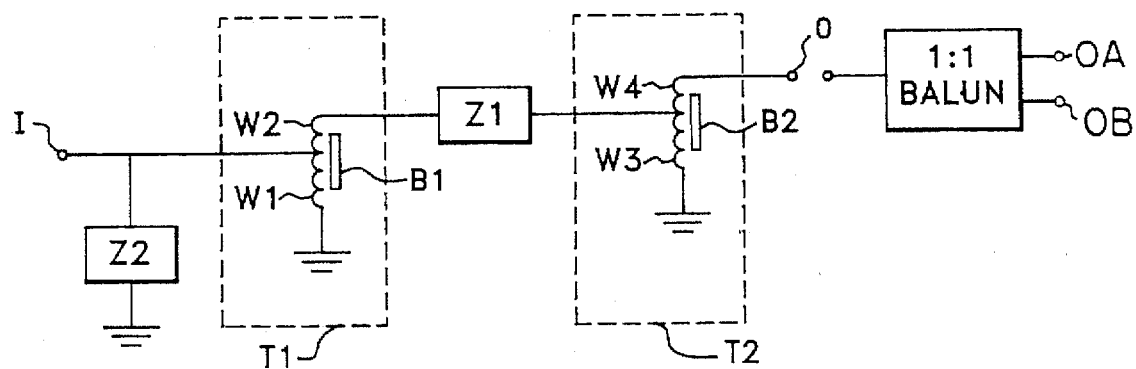
FIG. 1 is a basic electrical schematic circuit diagram of a high impedance ratio wideband transformer circuit embodying features of the present invention.

Referring now to FIG. 1 there is shown a basic high impedance ratio wideband transformer circuit embodying features of the present invention including a first transformer T1 having a first winding W1 connected to a low impedance port I and having a second winding W2. The first and second windings W1 and W2 are wound on a core B1 with the windings inductively coupled to one another. There is also provided a second transformer T2 having a first winding W3 and a second winding W4. The second winding W2 of the first transformer T1 is connected to the first winding W3 of the second transformer T2 via a first reactive impedance Z1. The first and second windings W3 and W4 are wound on a core B2 with the windings inductively coupled to one another. The second winding W4 of the second transformer T2 is connected to a high impedance port O. A second reactive impedance Z2 is connected between the low input port I and ground. The output O is an unbalanced output. A 1:1 balun may be connected to the output O of the transformer circuit to provide a balanced output at terminals OA and OB.

Figure 2:
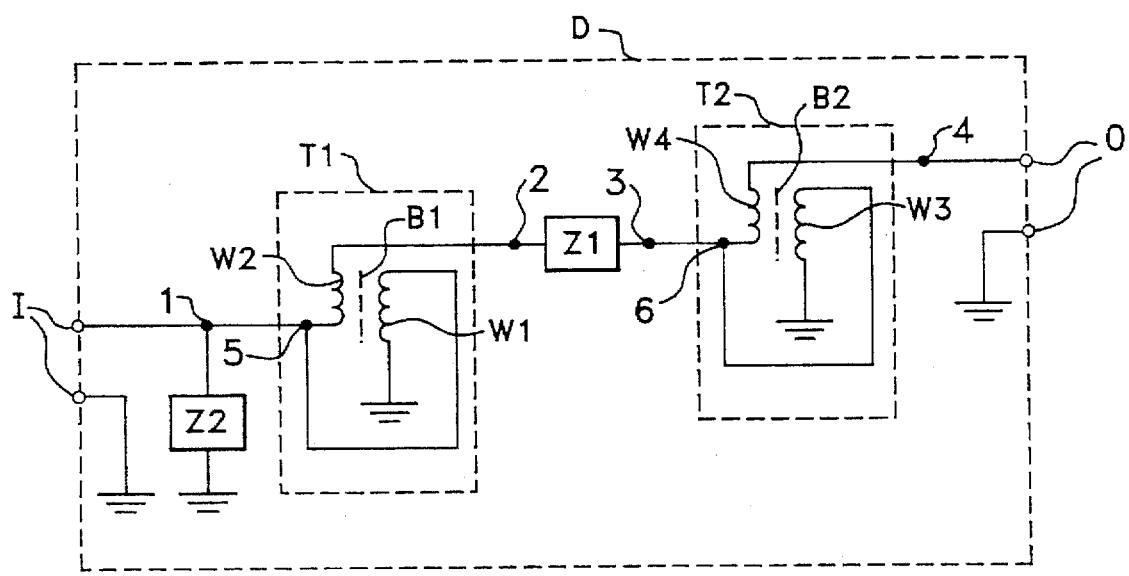
FIG. 2 is a more detailed electrical circuit diagram of the basic circuit shown in FIG. 1.

Referring now to FIG. 2 a more detailed diagram of the transformer circuit of the present invention is shown and is designated by letter D. Transformer circuit D is shown as having a pair of input terminals I and a pair of output terminals O. The first reactive impedance Z1 is connected in series between nodes 2 and 3, respectively, and the second reactive impedance Z2 is connected between node 1 and ground. A reactive impedance is an impedance whose reactance changes with frequency. Reactive impedances Z1 and Z2 provide compensation for impedance versus frequency in the circuit. First winding W1 has one side connected to ground and the other side connected to node 5 which is also connected to node 1. Second winding W2 has one side connected to node 5 and the other side connected to node 2. The second reactive impedance Z2 is connected between node 1 and ground. The second transformer T2 has a first winding W3 connected between ground and node 6. The second winding W4 of transformer T2 is connected between node 6 and node 4 which is connected to an output terminal O.

More specifically, the transformer T1 is connected as an autotransformer with first winding W1 being a primary winding and second winding W2 being a secondary winding. Similarly, transformer T2 is connected as an autotransformer with first winding W3 being a primary winding and winding W4 being a secondary winding.

Figure 3:
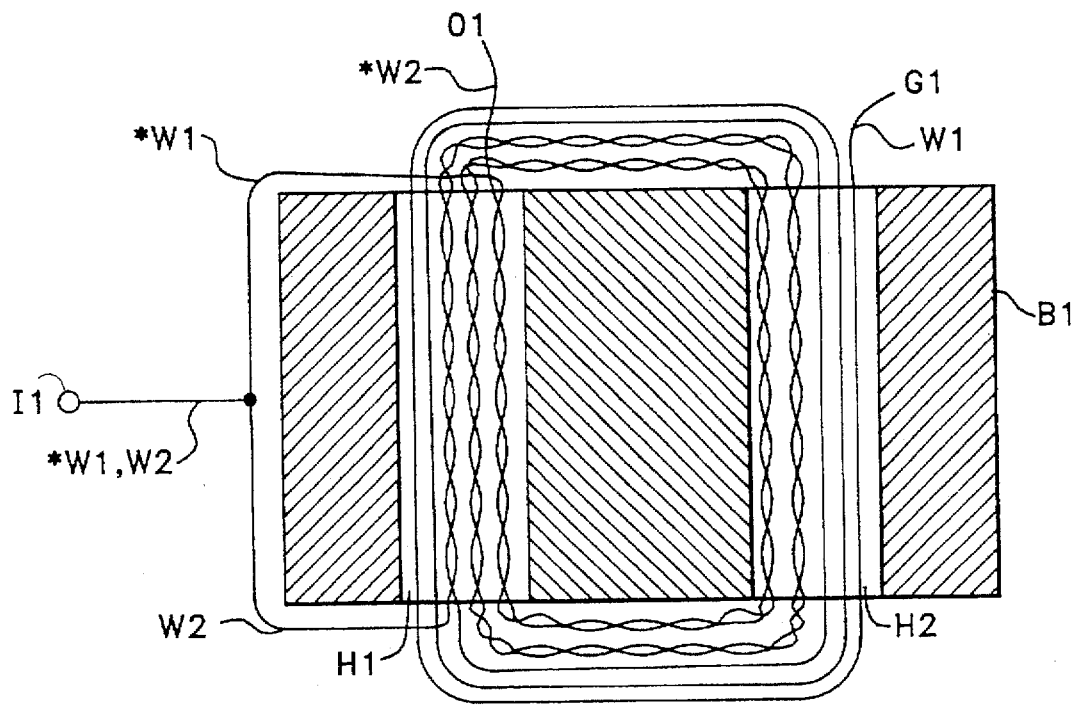
FIG. 3 is a sectional view of the first transformer shown in FIGS. 1 and 2.

Generally stated, transformers T1 and T2 are transmission line transformers. Referring now to FIG. 3 there is shown a transformer T1 found suitable to practice the present invention and is later referred to herein in more detail in Example 1. Transformer T1 has a miniature double aperture ferrite core having a rectangular core body B1 with rounded ends and having a pair of spaced apertures H1 and H2 formed in the core body. There is shown in FIG. 3 two and one half (2.5) turns of twisted wire designated wires *W1 and *W2 which are wound on core body B1 through apertures H1 and H2 and the wire is then separated. At the point of separation wire *W2 is designated wire W2. Wire *W1 is wound two and a half turns more and is designated wire W1. Wires *W1 and W2 are then connected to form a center tap which is the input to the transformer T1 and specifically is connected to the ungrounded side of winding W1 and is designated I1. Wires *W2 and W1 are designated O1 and G1, respectively, for the transformer. The transformer T1 is installed in the circuit such that I1 is node 5 and O1 is node 2 and G1 is grounded as shown in FIG. 2. The primary winding W1 of T1 then has 5 turns and the secondary winding W2 of T1 has seven and one half (7.5) turns.

Figure 7A:
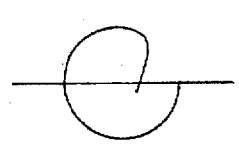
FIG. 7A is a representation of reactive impedance on the Smith chart showing the response of the circuit if the second reactive impedance is excessive.
Figure 7B:
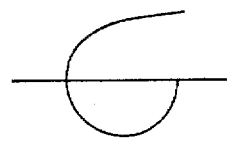
FIG. 7B is a representation of reactive impedance on the Smith chart showing the response of the circuit if the second reactive impedance is insufficient.
Figure 7C:
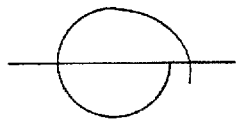
FIG. 7C is a representation of reactive impedance on the Smith chart showing the response of the circuit if the first reactive impedance is excessive.
Figure 7D:
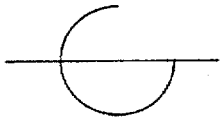
FIG. 7D is a representation of reactive impedance on the Smith chart showing the response of the circuit if the first reactive impedance is insufficient.
Figure 7E:
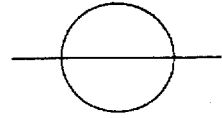
FIG. 7E is a representation of reactive impedance on the Smith chart showing the correct balance of the first and second reactive impedances which is the desired response for the circuit.

A reactive inductance Z1 found suitable for practicing the present invention is a single strand of enamel coated magnet wire of which the gauge is not critical provided the wire is wound on a phenolic toroid core. With this structure the inductance of the inductor can be adjusted to close the loop as shown in FIG. 7E.

Figure 4:
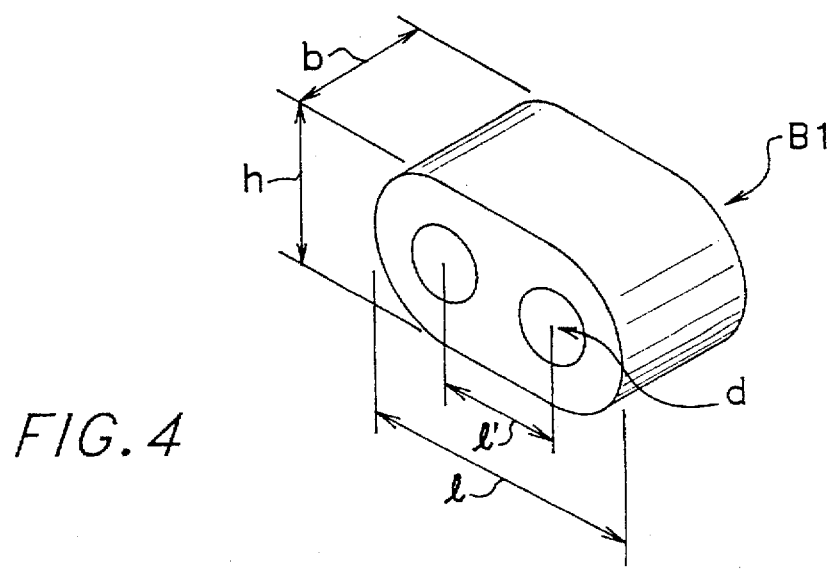
FIG. 4 is a perspective view of the core shown in FIG. 3 showing the locations of the core dimensions for reference purposes.

The locations of the dimensions on the core B1 are shown in FIG. 4 for reference purposes and are designated as width "b", height "h", diameter of apertures "d", distance between centers of the apertures 1' and length of the core "l".

Figure 5:
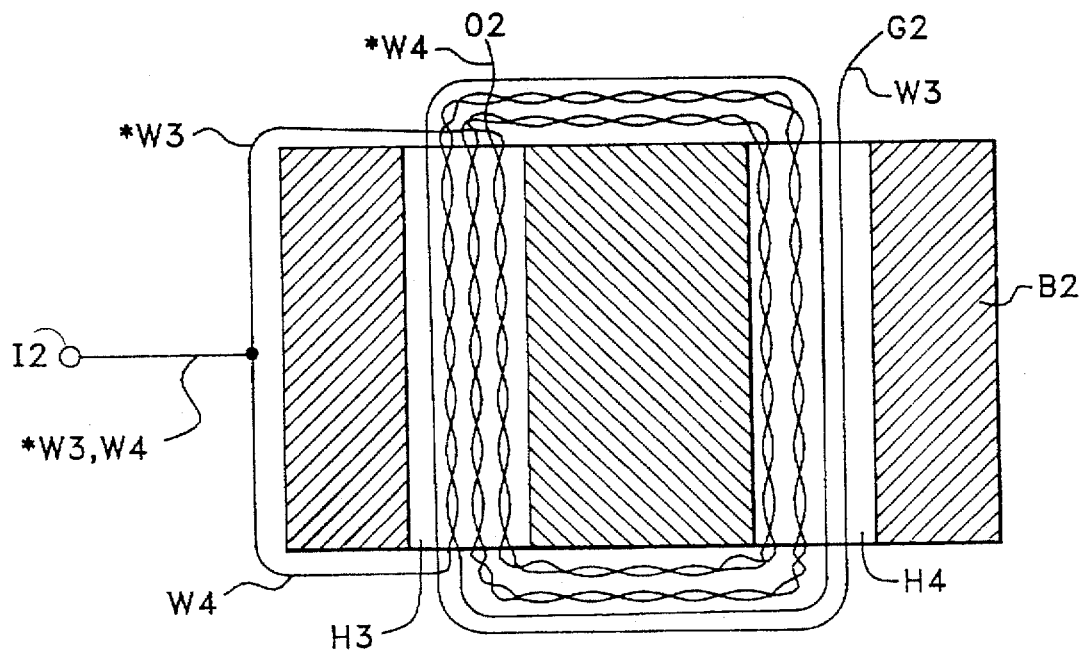
FIG. 5 is a sectional view of the second transformer shown in FIGS. 1 and 2.

Referring now to FIG. 5 transformer T2 is similar in construction to transformer T1 previously described. There is shown in FIG. 5 a twisted pair of separate wires designated *W3 and *W4. Two and a half turns of the twisted wire are wound on the double aperture core B2 through apertures H3 and H4. The wires are then separated. At the point of separation wire *W4 is designated wire W4. Wire *W3 is wound one and a half turns more and designated W3. Wires *W3 and W4 are then connected to form a center tap which is the input to the transformer designated I2. Wires *W4 and W3 are designated O2 and G2, respectively. The circuit is arranged so that with reference to FIG. 2 I2 is node 6 and O2 is node 4 and G2 is grounded. The primary winding W3 of T2 has four turns and the secondary winding W4 of T2 has six and one half (6.5) turns.

Figure 6:
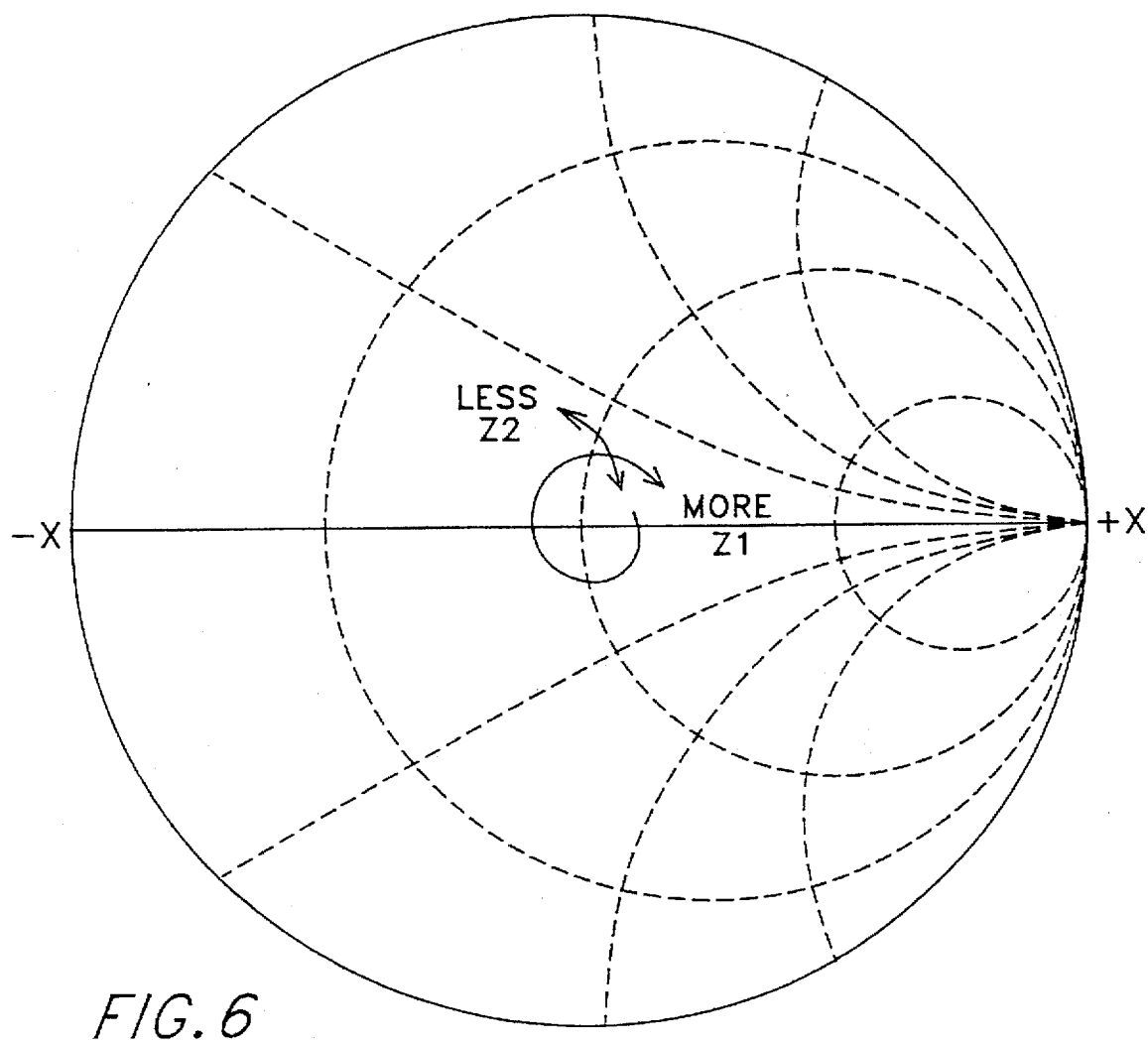
FIG. 6 is a Smith chart showing the composite contribution of the impedances in the circuit for the transformer circuit shown in FIGS. 1–5.

Referring now to FIG. 6 the Smith chart shown is a graph having real impedance plotted along a horizontal axis with increasing impedance designated +X being to the right and at one end being infinite impedance (open circuit) and decreasing impedance designated −X to the left and at the other end being minimum (short circuit). Inductive reactance is above the axis and capacitive reactance is below the axis. Constant resistance is indicated on the diagram as a dashed line intersecting the horizontal axis. The effect of changing reactive impedance Z1 is indicated in the direction of the arrow and less reactive impedance Z1 in the direction opposite the arrow. The effect of changing reactive impedance Z2 is indicated with more reactive impedance Z2 and less reactive impedance Z2. The desired response is a perfect circle with a minimum diameter central about the locus indicating the desired match between input and output impedances.

Referring now to FIGS. 7A through 7E, 7A shows a circuit response if reactive impedance Z2 is excessive, 7B shows the circuit response if reactive impedance Z2 is insufficient, 7C shows the circuit response if reactive impedance Z1 is excessive, 7D shows the circuit response if reactive impedance Z1 is insufficient and 7E shows the correct balance of reactive impedance Z1 and Z2 which is the desired response of the circuit.

In general, implementation of the circuit dictates that transformer T1 and transformer T2 (and balun for the balanced output) must be designed such that they perform satisfactorily independently. It is well known that the $A_L$ ($L_P$) parameter for the core in conjunction with the numbers of turns on the low impedance side of a transformer dictates the low frequency performance.

Inherent in all transformers wound on a core is a component resistance Rp (parallel resistance associated with core loss and is material dependent) that must be considered in all transformer designs. Ideally the value of resistance Rp would be infinite for minimum loss, but in reality has some finite value and must be considered. Resistance Rp which is a function of the number of turns squared is critical for transformer T2 if the circuit is used in an impedance step up configuration but is also an important consideration with respect to transformer T1. For example, if the circuit is configured as a 9:1 step up transformer and the input and output impedances are 50 and 450 ohms, respectively, then the resistance Rp of the transformer T2 secondary must be at least 3 to 4 times the value of the output impedance at point 0 to minimize insertion loss.

Referring to FIG. 2, the resistance Rp of transformer T1 would be a resistor connected from node 2 and to ground (in parallel with the secondary of transformer T1). Since resistance Rp is a function of the core material and the number of turns of wire on the secondary of the transformer, it is therefore not shown in the figure as an additional component. The resistance Rp of transformer T2 would be a resistor connected from node 4 and to ground (in parallel with the secondary of transformer T2). As with transformer T1, resistance Rp is a function of the core material and the number of turns of wire on the secondary of the transformer and therefore is not shown in the figure as an additional component.

Resistance Rp is an important consideration in overall design of the circuit since the resistance Rp of transformer T2 is in parallel with the load that would be connected to point 0. This effectively lowers the impedance at node 4. In addition, the same phenomenon is present at node 2 of transformer T1 and has the same effect on transformer T1. With the ratio multiplying nature of the embodiment, the overall effect is that the resultant input impedance at I is lower than the expected 9:1. Referring to FIG. 6, the lower impedance shifts the response in the −X direction on the Smith chart.

In the circuit shown and described transformers T1 and T2 in general compensate for the lower equivalent impedance seen at I by decreasing the impedance step-up ratio of transformers T1 and T2. Decreasing the impedance step-up ration of transformers T1 and T2 shifts the circuit response in the +X direction of FIG. 6. In summary, the change of the turns ratio is used to shift the circuit response to the right and correct for the lower equivalent impedance seen at I.

While two transformers connected in series and with the reactive impedances Z1 and Z2 as shown has been found to provide higher impedance ratios over a wider range of frequencies, it is understood that the same principle may be used employing only a single transformer. For example, only reactive impedances Z1 and Z2 with transformer T1 may be used with the output at node 3. This circuit would have lower impedance ratios but the Smith chart, balancing of the reactive impedances and adjustment of turns on the transformers would be the same.

EXAMPLE 1

The impedance and the characteristics of the transformers that provide a 1:9 impedance ratio and bandwidth of about 5 MHz to 1.2 GHz are summarized as follows:

Z1=Inductor=2.7 nanohenries
Z2=Capacitor=1.0 picofarad
*W1 and *W2=2.5 turns
W1=5 turns
W2=7.5 turns
W3=4 turns
W4=6.5 turns
Core Rp for T1 and for T2=32 ohms/turns squared Core dimensions l=2.70 mm
 $l_- $=1.35 mm
 h=1.30 mm
 d=0.50 mm
Core material 82 material of Krystinel $$Rp \text{ for } T1 = (W2)^2 \times \text{Core } Rp$$
$$(7.5)^2 \times (32) = 1800 \text{ ohms}$$
$$Rp \text{ for } T2 = (W4)^2 \times (32)$$
$$(6.5)^2 \times (32) = 1352 \text{ ohms}$$

Where I=50 ohms
 O=450 ohms
Where I=50 ohms
 Z at node 2=150 ohms
 Z at node 4=450 ohms
Impedance ratio 1:9

EXAMPLE 2

The impedances and the characteristics of the transformers that provide a 1:12 impedance ratio and a bandwidth of about 10 MHz to 1000 MHz are summarized as follows:

Z1=Inductor=2.7 nanohenries
Z2=Capacitor=1.8 picofarad
*W1 and *W2 for T1=2.0 turns
*W1 and *W2 for T2=2.5 turns
W1=4.5 turns
W2=6.5 turns
W3=3.0 turns
W4=5.5 turns
Core Rp for T1=32 ohms/turns squared
Core Rp for T2=80 ohms/turns squared
Core dimensions for T1 l=2.70 mm
 l=1.35 mm
 h=1.30 mm
 d=0.50 mm
Core dimensions for T2 l=3.5 mm
 $l_1$=1.40 mm
 h=2.06 mm
 d=0.76 mm
Core material for T1 82 material of Krystinel
Core material for T2 81 material of Krystinel $$RP \text{ for } T1 = (W2)^2 \times \text{Core } Rp$$
$$(6.5)^2 \times (32) = 1352 \text{ ohms}$$
$$Rp \text{ for } T2 = (W4)^2 \times \text{Core } Rp$$
$$(5.5) \times (80) = 2420 \text{ ohms}$$

EXAMPLE 3

The impedances and the characteristics of the transformers that provide a 1:16 impedance ratio and a bandwidth of about 10 MHz to 600 MHz are summarized as follows:

Z1=Inductor=4.8 nanohenries
Z2=Capacitor=2.2 picofarads
*W1 and *W2 for T1=1.5 turns
*W1 and *W2 for T2=2.5 turns
W1=4.5 turns
W2=6.0 turns
W3=2.5 turns W4=5.0 turns
Core Rp for T1=32 ohms/turns squared
Core Rp for T2=80 ohms/turns squared
Core dimensions for T1 l=2.70 mm Core dimensions for T1 1 = 2.70 mm
   L = 1.35 mm
   h = 1.30 mm
   d = 0.50 mm
   Core dimensions for T2 1 = 3.5 mm
   L = 1.40 mm
   h = 2.06 mm
   d = 0.76 mm
   Core material for T1 82 material of Krystinel
   Core material for T2 81 material of Krystinel $Rp$ for $T1 = (W2)^2 \times$ Core $Rp$ $(6.0)^2 \times (32) = 1080$ ohms $Rp$ for $T2 = (W4)^2 \times$ Core $Rp$ $(5.0)^2 \times (80) = 2000$ ohms It is understood the above described circuits can be used for step-down applications by using the output O as an input.

Figure 8:
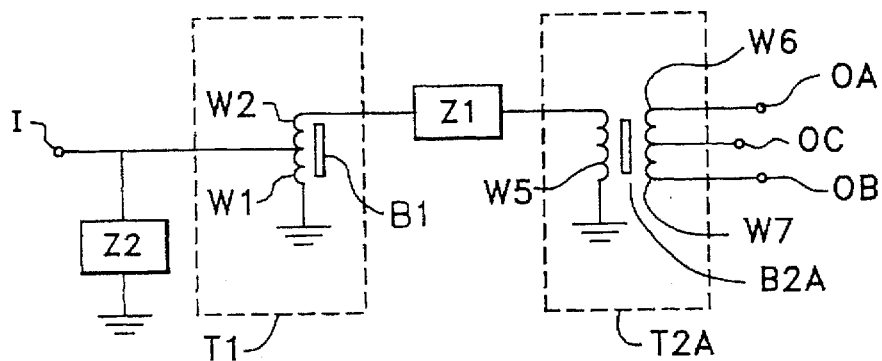
FIG. 8 is a basic electrical schematic circuit diagram of a second embodiment of a high impedance ratio wideband unbalanced input to balanced output transformer circuit embodying features of the present invention.

Referring now to FIG. 8 there is shown a second embodiment of a high impedance ratio wideband transformer circuit embodying features of the present invention substantially similar to the previously described embodiment except that the second transformer and the 1:1 balun are incorporated into a single 4:1 impedance ratio transformer providing an unbalanced low impedance to balanced high impedance two stage transformer circuit. The second transformer used in this second embodiment is D.C. isolated from the input to the output and is herein referred as a D.C. isolated transformer.

In the second embodiment there is provided a first transformer T1 that is a transmission line transformer having a first winding W1 connected to a low impedance port I and having a second winding W2. The first and second windings W1 and W2 are wound on a core B1 with the windings inductively coupled to one another. There is also provided a second transformer T2A having a first winding W5, a second winding W6, and a third winding W7. The second winding W2 of the first transformer T1 is connected to the first winding W5 of the second transformer T2A via a first reactive impedance Z1. The first winding W5, second winding W6 and third winding W7 of the second transformer T2A are wound on a core B2A with the windings inductively coupled to one another. The second winding W6 of the second transformer T2A is connected to a first high impedance output terminal OA and the third winding W7 of the second transformer T2 is connected to a second high impedance output terminal OB, providing a balanced output between first high impedance output terminal OA and second high impedance output terminal OB. The second winding W6 and third winding W7 of the second transformer are connected together to form a third output terminal OC. A second reactive impedance Z2 is connected between the low impedance input port I and ground.

Figure 9:
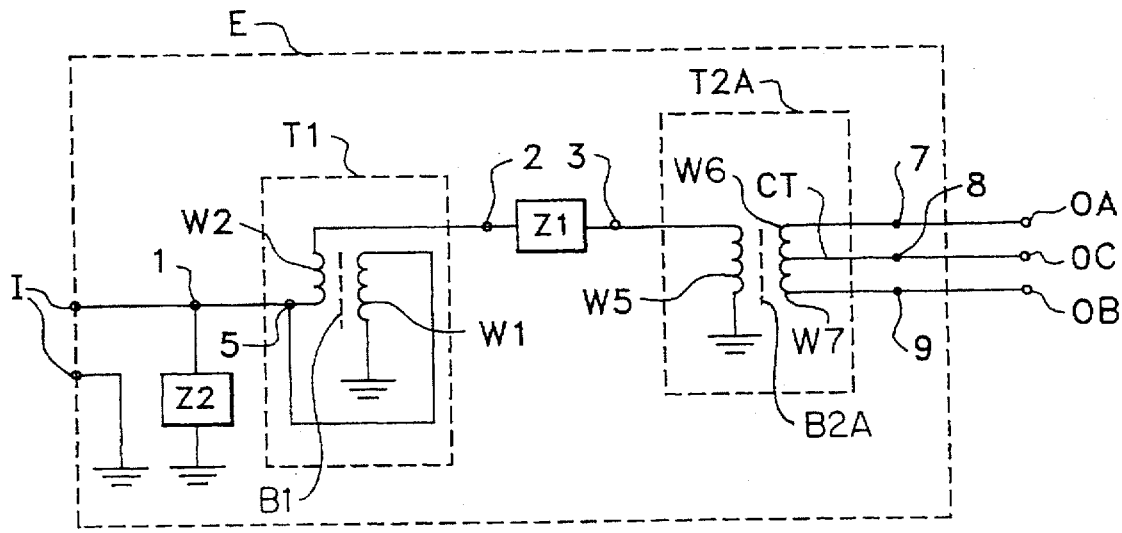
FIG. 9 is a more detailed electrical circuit diagram of the basic circuit shown in FIG. 8.

Referring now to FIG. 9 a more detailed diagram of the transformer circuit of the second embodiment of the present invention is shown and is designated by letter E. Transformer circuit E is shown as having a pair of input terminals I, a first output terminal OA, a second output terminal OB, and a center tap third output terminal OC. The first reactive impedance Z1 is connected in series between nodes 2 and 3, respectively, and the second reactive impedance Z2 is connected between node 1 and ground. First winding W1 has one side connected to ground and the other side connected to node 5 which is also connected to node 1. Second winding W2 has one side connected to node 5 and the other side connected to node 2. The second reactive impedance Z2 is connected between node 1 and ground. The second transformer T2A has a first winding W5 connected between ground and node 3. The second winding W6 of transformer T2 is connected between node 7 which is connected to output terminal OA and node 8 which is connected to output terminal OC. The third winding W7 of transformer T2A is connected between node 8 and node 9 which is connected to an output terminal OB.

Figure 10:
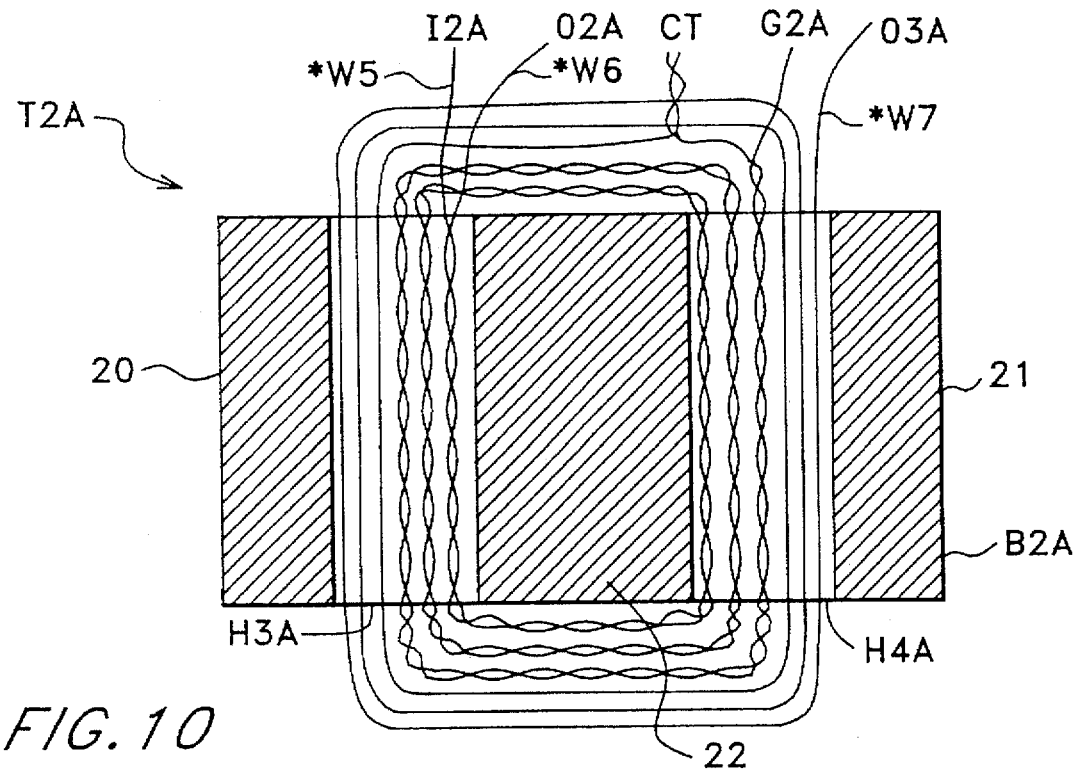
FIG. 10 is a sectional view of the D.C. isolated second transformer T2 shown in FIGS. 8 and 9.

More specifically, in the second embodiment, transformer T2A is connected as a conventional transformer with first winding W5 being a primary winding and windings W6 and W7 being the secondary winding with a center tap CT. Referring now to FIG. 10 there is shown a transformer T2A found suitable to practice the present invention and later referred to herein in more detail in Example 4. The designation *W is used to designate a wire that is wrapped to form a winding having a similar designation W. For example, *W1 is a wire forming the winding W1.

Transformer T2A has a miniature double aperture ferrite core having a rectangular core body B2A with first and second rounded end portions 20 and 21, first and second spaced apertures H3A and H4A formed in the core body, and central core portion 22 between the apertures H3A and H4A as illustrated in FIG. 10. There is shown in FIG. 10 a twisted pair of wires designated wires *W5 and *W6 with a first end of wire *W5 forming input I2A and a first end of wire *W6 forming output O2A. The twisted pair of wires *W5 and *W6 are wound three (3) turns on core body B2A around central core portion 22 through apertures H3A and H4A, and then separated. At the point of separation wire *W5 forms ground G2A and wire *W6 is connected to a first end of wire *W7 forming a center tap CT. Wire *W7 is wound three (3) turns more, at which point wire *W7 forms output O3A. The transformer T2A is installed in the circuit as shown in FIG. 9 such that I2A is node 3, O2A is node 7, CT is node 8, O3A is node 9 and G2A is grounded. The primary winding W5 of T2A then has about three (3) turns. The secondary winding of T2A includes W6 and W7, and has about six (6) turns.

The second transformer T2A provides balanced 4:1 step-up impedance between first output terminal OA and second output terminal OB, if center tap third output terminal OC is open. If center tap third output terminal OC is grounded, the second transformer T2A provides unbalanced 2:1 step-up impedance at the first output terminal OA and the second output terminal OB.

The parallel resistance associated with core loss, Rp, is an important consideration in overall design of the circuit as previously described. The present invention divides the impedance transformation into two stages where the total impedance step-up ratio of the circuit is the product of the impedance ratios of first transformer T1 and second transformer T2A. The second transformer T2A is a 4:1 impedance ratio transformer.

For the 4:1 impedance ratio second transformer T2A, the design of the first transformer may be calculated based on the desired circuit step-up ratio, the desired output impedance and the core material of the transformers T1 and T2A. As an example, let the desired output to input impedance ratio be 9:1, the desired input impedance be 50Ω, the desired output be output impedance be 450Ω, the core material for the first transformer T1 be 82 material of Krystinel with core Rp of about 32Ω/turns$^2$, and the core material for the second transformer T2A be 81 material of Krystinel with core Rp of about 80Ω/turns$^2$.

The parallel resistance Rp of the second transformer T2A is (6 turns)$^2$*80Ω/turns$^2$=2880Ω. The 450Ω impedance of the second transformer T2A and the parallel resistance are in parallel so the impedance across the secondary winding is (2880Ω*450Ω)/(2880Ω+450Ω)=389Ω. The 389Ω appears at the input of the 4:1 impedance ratio second transformer T2A as 389Ω/4=97Ω.

If the first transformer T1 has five turns on the secondary winding, the parallel resistance Rp is (5 turns)$^2$*32Ω/turns$^2$= 800Ω. The equivalent impedance is the 97Ω output impedance in parallel with the 800Ω parallel resistance, (97Ω*800Ω)/(97Ω+800Ω)=86Ω. If the primary winding of the first transformer T1 has four turns then the transformer impedance ratio is (4/5)$^2$=0.64. The impedance at the input of the first transformer T1 is 0.64*86Ω=55Ω or about 50Ω.

EXAMPLE 4

The impedance and the characteristics of the transformers that provide about a 1:9 impedance ratio and bandwidth of about 10 MHz to 1.6 GHz are summarized as follows:

Z1=Inductor=about 0.3 nanohenries
Z2=Capacitor=about 0.8 picofarads
W1=about 4 turns
W2=about 5 turns
W5=about 3 turns
W6=about 3 turns
W7=about 3 turns
Core Rp for T1=about 32 ohms/turns squared

| Core dimensions for T1 | $l$ = 2.70 mm |
|---|---|
| | $l'$ = 1.35 mm |
| | $h$ = 1.30 mm |
| | $d$ = 0.50 mm |
| Core material for T1 | 82 material of Krystinel |
| Core $Rp$ for T2A = about 80 ohms/turns squared | |
| Core dimensions for T2A | $l$ = 3.5 mm |
| | $l'$ = 1.40 mm |
| | $h$ = 2.06 mm |
| | $d$ = 0.76 mm |
| Core material for T2A | 81 material of Krystinel |

EXAMPLE 5

The impedances and the characteristics of the transformers that provide about a 1:12 impedance ratio and a bandwidth of about 10 MHz to 1.2 GHz are summarized as follows:

Z1=Inductor=about 2.7 nanohenries
Z2=Capacitor=about 1.0 picofarad
W1=about 6 turns
W2=about 8 turns
W5=about 3 turns
W6=about 3 turns
W7=about 3 turns
Core Rp for T1=about 32 ohms/turns squared

| Core dimensions for T1 | $l$ = 2.70 mm |
|---|---|
| | $l'$ = 1.35 mm |
| | $hj$ = 1.30 mm |
| | $d$ = 0.50 mm |
| Core material for T1 | 82 material of Krystinel |
| Core $Rp$ for T2A = about 80 ohms/turns squared | |
| Core dimensions for T2A | $l$ = 3.5 mm |
| | $l'$ = 1.40 mm |
| | $h$ = 2.06 mm |
| | $d$ = 0.76 mm |
| Core material for T2A | 81 material of Krystinel |

EXAMPLE 6

The impedances and the characteristics of the transformers that provide a about 1:16 impedance ratio and a bandwidth of about 10 MHz to 1.0 GHz are summarized as follows:

Z1=Inductor=about 2.7 nanohenries
Z2=Capacitor=about 1.0 picofarad
W1=about 5 turns
W2=about 7 turns
W5=about 3 turns
W6=about 3 turns
W7=about 3 turns
Core Rp for T1 and T2A=about 32 ohms/turns squared

| Core dimensions for T1 and T2A | $l$ = 2.70 mm |
|---|---|
| | $l'$ = 1.35 mm |
| | $h$ = 1.30 mm |
| | $d$ = 0.50 mm |

Core material for T1 and T2A 82 material of Krystinel

Figure 11:
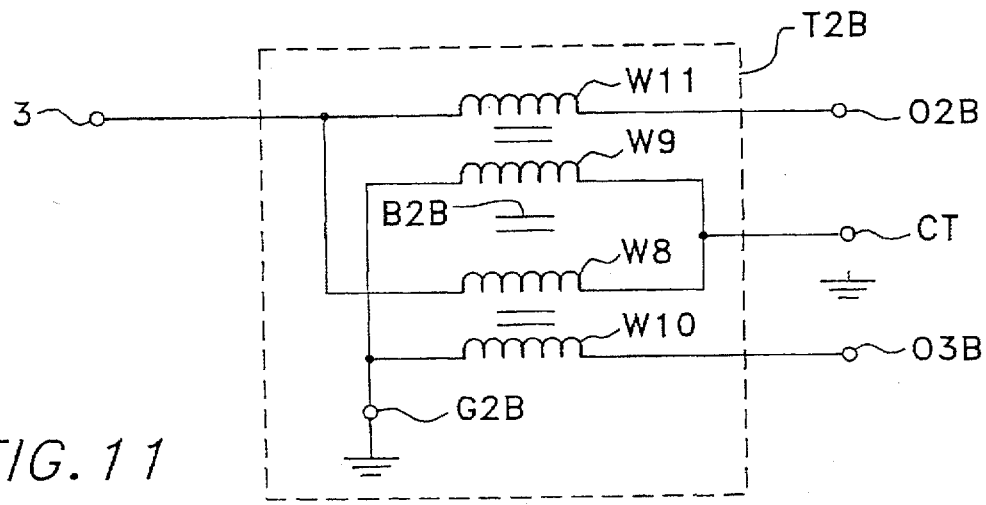
FIG. 11 is an electrical schematic circuit diagram of a third embodiment having an alternative D.C. coupled second transformer.

A third embodiment is substantially similar to the second embodiment except that the second transformer T2B provides D.C. coupling between the primary and secondary windings, and is herein referred to as a D.C. coupled transformer. The third embodiment incorporates the 1:1 balun into a 4:1 impedance ratio second transformer providing an unbalanced low impedance to balanced high impedance two stage transformer circuit. Referring now to FIG. 11 there is shown the electrical schematic diagram of the second transformer T2B for a third embodiment of a high impedance ratio wideband transformer circuit embodying features of the present invention.

The second transformer T2B has a first winding W8 connected between node 3 and a center tap CT. A second winding W9 of transformer T2B is connected between the center tap CT which connects to node 8 and a third winding W10. At the point of connection of windings W9 and W10 transformer T2B is connected to ground. Winding W10 connects from winding W9 to node 9. A fourth winding W11 of transformer T2B connects between node 3 and node 7.

More specifically, in the third embodiment, transformer T2B is connected as a D.C. coupled transformer with first winding W8 and second winding W9 being the primary winding, and windings, W10 and W11 being the secondary winding.

Figure 12:
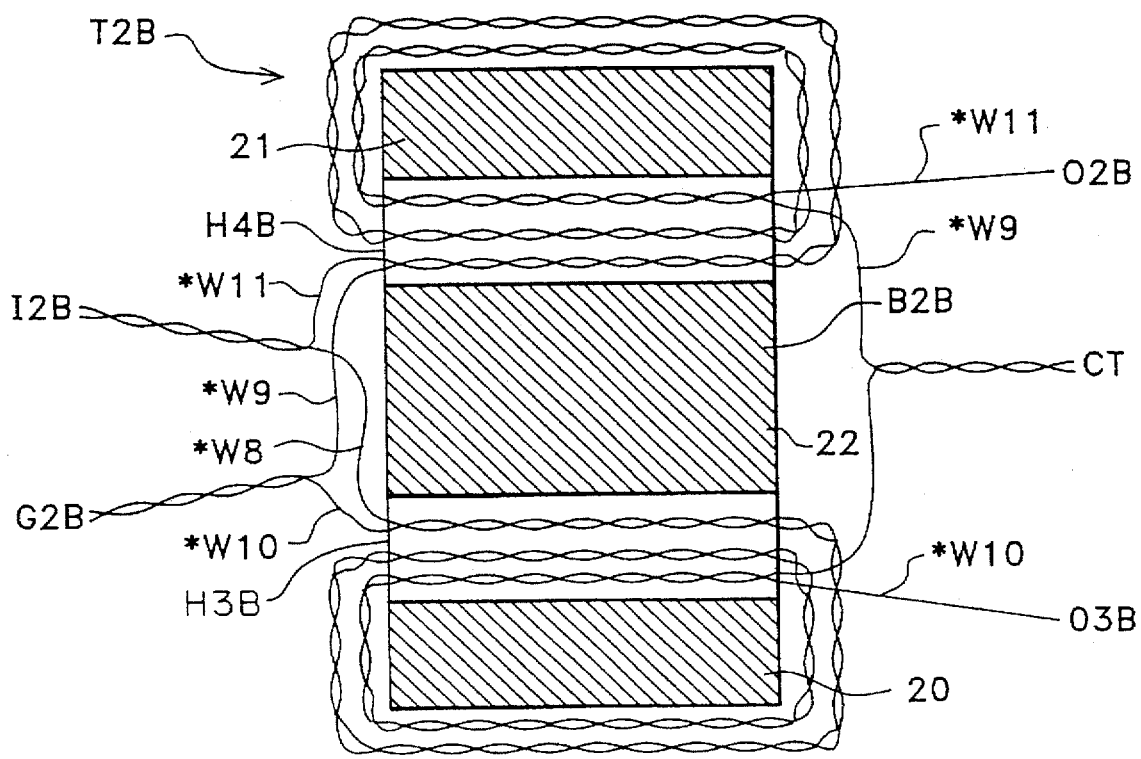
FIG. 12 is a sectional view of the D.C. coupled second transformer shown in FIG. 11.

Referring now to FIG. 12 there is shown a transformer T2B found suitable to practice the present invention. Transformer T2B has a miniature double aperture ferrite core having a rectangular core body B2B with first and second rounded end portions 20 and 21, first and second spaced apertures H3B and H4B formed in the core body, and central core portion 22 between the apertures H3B and H4B as illustrated in FIG. 10. There is shown in FIG. 12 a first twisted pair of wires *W8 and *W10, and second twisted pair of wires *W9 and *W11. The first twisted pair of wires *W8 and *W10 are wound three (3) turns on core body B2B through aperture H3B and around end portion 20 and the wires *W8 and *W10 are then separated at which point wire *W10 forms output O3B. The second twisted pair of wires *W9 and *W11 are wound three (3) turns on core body B2B through aperture H4B and around end portion 21, and the wires *W9 and *W11 are then separated at which point wire *W11 forms output O2B. A first end of wire *W8 and a first end of wire *W11 are connected forming input I2B. A first end of wire *W9 and a first end of wire *W10 are connected forming ground G2B. The second end of wire *W8 is connected to the second end of wire *W9 to form center tap CT.

The transformer T2B is installed in the circuit shown in FIG. 9 to replace the second transformer T2Z such that I2B is node 3, O2B is node 7, CT is node 8, O3B is node 9 and G2B is grounded.

The second and third embodiments as described provide a greatly increased bandwidth in the range of 10 MHz to 1.6 GHz. As a result of incorporating the balun into the second transformer the circuit requires only two ferrite cores compared to the three required in the previously described circuit. The material, manufacturing costs and physical size of the circuit are greatly reduced without degradation in the performance.

It is understood that commercially available D.C. isolated and D.C. coupled transformers are suitable for use as the second transformer in the second and third embodiments. For example, the Vari-L Model FP-522 is a D.C. coupled transformer suitable for use in the third embodiment of the present invention and the Vari-L Model FP-510 is a D.C. coupled transformer also suitable for use in the third embodiment.

Although the present invention has been described with a certain degree of particularity, it is understood that the present disclosure has been made by way of example and that changes in details of structure may be made without departing from the spirit thereof.

What is claimed is:

1. A high impedance ratio wideband transformer circuit comprising:

transmission line transformer means having a first port and a second port, said transmission line transformer means including first and second transformers, said first transformer being a transmission line transformer having a first primary winding and a first secondary winding inductively coupled to said first primary winding, said second transformer being a transmission line transformer having a second primary winding and a second secondary winding that provides a balanced output, said second secondary winding inductively coupled to said second primary winding, said first and second transformers connected in series so that the impedance ratio of said first transformer is multiplied by the impedance ratio of said second transformer to reduce the length of said first and second secondary windings of said transformers thereby increasing the range of frequency, a first reactive impedance connected between said first secondary winding and said second primary winding, a second reactive impedance connected at said first port with the values of said first and second reactive impedances being selected to optimize an impedance match from said first port to said second port for a selected turns ratio of said transmission line transformer means and a desired transformation ratio and frequency response to provide transformation ratios of above about 4:1 over a range of frequencies of about 10 MHz to 1.6 GHz.

2. A transformer circuit as set forth in claim 1 wherein said first transformer includes a miniature ferrite first core, said second transformer includes a second miniature ferrite second core, each of said first and second cores having a first end portion and a second end portion, a first spaced aperture adjacent said first end portion, a second spaced aperture adjacent said second end portion, and a central core portion between said first and second spaced apertures.

3. A transformer circuit as set forth in claim 2 wherein said first primary winding includes a first wire, said first secondary winding includes a second wire, said first wire and said second wire being twisted together to form a first twisted pair of wires, said first twisted pair of wires being wrapped a selected number of turns on said first core, said second primary winding includes a third wire, said second secondary winding includes a fourth wire, said third wire and said fourth wire being twisted together to form a second twisted pair of wires, said second twisted pair of wires being wrapped a selected number of turns on said second core.

4. A transformer circuit as set forth in claim 3 wherein said first transformer is an autotransformer having a first end of said first wire connected to a first end of said second wire to form said first port, a second end of said first wire connected to ground, a second end of said second wire connected to said first reactive impedance, so that said first secondary winding includes said first wire and said second wire, said first twisted pair of wires is wound on said first core around said central core portion through both of said first and second apertures.

5. A transformer circuit as set forth in claim 4 wherein said second secondary winding has a center tap which is grounded provide differential unbalanced output.

6. A transformer circuit as set forth in claim 5 wherein said second transformer is a D.C. isolated transformer 7.

7. A transformer circuit as set forth in claim 6 wherein said third wire and said fourth wire electrically are separated from each other, said second secondary winding further includes a fifth wire, a first end of said fourth wire connects to a first end of said fifth wire to form said center tap, a second end of said fourth wire forms a first output terminal, a second end of said fifth wire forms a second output terminal, said center tap forms a third output terminal, said second twisted pair of wires and said fifth wire are wound on said second core around said central core portion through both of said first and second apertures, said second port includes said first, second, and third output terminals.

8. A transformer circuit as set forth in claim 7 wherein said second primary winding has about 3 turns, and said second secondary winding has about 6 turns.

9. A transformer circuit as set forth in claim 8 wherein said first transformer has a core resistance of about 32 ohms per turn squared and said second transformer has a core resistance of about 80 ohms per turn squared.

said first primary winding has about 4 turns, and said first secondary winding has about 5 turns.

10. A transformer circuit as set forth in claim 8 wherein said first transformer has a core resistance of about 32 ohms per turn squared and said second transformer has a core resistance of about 80 ohms per turn squared, said first primary winding has about 6 turns, and said first secondary winding has about 8 turns.

11. A transformer circuit as set forth in claim 8 wherein said first transformer and said second transformer each have a core resistance of about 32 ohms per turn squared, said first primary winding has about 5 turns, and said first secondary winding has about 7 turns.

12. A transformer-circuit as set forth in claim 5 wherein said second transformer is a D.C. coupled transformer.

13. A transformer circuit as set forth in claim 12 wherein said second transformer has a third primary winding and a third secondary winding, said third primary winding having a fifth wire, said third secondary winding having a sixth wire, said fifth wire and said sixth wire being twisted together to form a third twisted pair of wires, a first end of said third wire connects to a first end of said sixth wire and to said first reactive impedance, a second end of said third wire connects to a first end of said fifth wire to form a center tap, a second end of said fifth wire connects to a first end of said fourth wire and to ground, a second end of said sixth wire forms a first output terminal, a second end of said fourth wire forms a second output terminal, said center tap forms a third output terminal, said second twisted pair of wires is wound on said second core around said first end portion through said first aperture, said third twisted pair of wires is wound on said second core around said second end portion through said second aperture, said second port includes said first, second, and third output terminals.

14. A transformer circuit as set forth in claim 12 wherein said second primary winding further includes a fifth wire, said second secondary winding includes said third wire, said fourth wire, said fifth wire and a sixth wire, said fifth wire and said sixth wire are twisted together to form a third twisted pair of wires, a first end of said-third wire connects to a first end of said sixth wire and to said first reactive impedance, a second end of said third wire connects to a first end of said fifth wire to form a center tap, a second end of said fifth wire connects to a first end of said fourth wire and to ground, a second end of said sixth wire forms a first output terminal, a second end of said fourth wire forms a second output terminal, said center tap forms a third output terminal, said second twisted pair of wires is wound on said second core around said first end portion through said first aperture, said third twisted pair of wires is wound on said second core around said second end portion through said second aperture, said second port including said first, second, and third output terminals.

15. A transformer circuit as set forth in claim 1 wherein said first reactive impedance is an inductor.

16. A transformer circuit as set forth in claim 1 wherein said first reactive impedance is an inductor, said inductor is a single strand enamel coated magnet wire wound on a phenolic toroid core.

17. A transformer circuit as set forth in claim 1 wherein said first reactive impedance is an inductor of about 0.3 nanohenries.

18. A transformer circuit as set forth in claim 1 wherein said first reactive impedance is an inductor of about 2.7 nanohenries.

19. A transformer circuit as set forth in claim 1 wherein said second reactive impedance is a capacitor.

20. A transformer circuit as set forth in claim 1 wherein said second reactive impedance is a capacitor having a value of about 0.8 picofarad.

21. A transformer circuit as set forth in claim 1 wherein said second reactive impedance is a capacitor having a value of about 1.0 picofarad.

22. A transformer circuit as set forth in claim 1 wherein there is provided about a 1:9 impedance ratio at a bandwidth of about 10 MHz to 1.6 GHz.

23. A transformer circuit as set forth in claim 1 wherein there is provided about a 1:12 impedance ratio at a bandwidth of about 10 MHz to 1.2 GHz.

24. A transformer circuit as set forth in claim 1 wherein there is provided about a 1:16 impedance ratio at a bandwidth of about 10 MHz to 1.0 GHz.

25. An unbalanced to balanced high impedance ratio wideband transformer circuit comprising:

a first transformer having a first primary winding connected to a low impedance port and having a first secondary winding, a second transformer having a second primary winding and a second secondary winding that provides a balanced output connected to a high impedance port a first reactive impedance connected between said first transformer secondary winding and said second transformer primary winding, and a second reactive impedance connected between said low impedance port and ground, the values of said first and second reactive impedances being selected to optimize an impedance match from said low impedance port to said high impedance port for a turns ratio of said transformer circuit and a desired transformation ratio and frequency response to provide transformation ratio above about 4:1 over a range of frequencies of about 10 MHz to 1.6 GHz, said first and second transformers being connected in series in a configuration with the secondary winding of said first transformer connected to said primary winding of said second transformer so that the impedance ratio of the first transformer is multiplied by the impedance ratio of the second transformer to reduce the length of said secondary windings of said first and second transformers, thereby increasing the range of frequency, each of said first and second transformers including a miniature ferrite core, said first primary winding including a first wire, said first secondary winding including a second wire, said first wire and said second wire being twisted together to form a first twisted pair of wires, said first twisted pair of wires being wrapped a selected number of turns on said first core, said second primary winding including a third wire, said second secondary winding including a fourth wire, said third wire and said fourth wire being twisted together to form a second twisted-pair of wires, said second twisted pair of wires being wrapped a selected number of turns on said second core.

* * * * *